(12) United States Patent
Lee et al.

(10) Patent No.: US 7,781,325 B2
(45) Date of Patent: Aug. 24, 2010

(54) COPPER PILLAR TIN BUMP ON SEMICONDUCTOR CHIP AND METHOD OF FORMING THE SAME

(75) Inventors: Kang Lee, Siheung-si (KR); Sang Jeen Hong, Siheung-si (KR)

(73) Assignee: Hwaback Engineering Co., Ltd., Siheung-Si, Gyeonggi-Do (KR)

( * ) Notice: Subject to any disclaimer, the term of this patent is extended or adjusted under 35 U.S.C. 154(b) by 0 days.

(21) Appl. No.: 12/271,737

(22) Filed: Nov. 14, 2008

(65) Prior Publication Data

US 2009/0127708 A1  May 21, 2009

(30) Foreign Application Priority Data

Nov. 16, 2007  (KR) .................. 10-2007-0117201

(51) Int. Cl.
*H01L 21/44* (2006.01)
(52) U.S. Cl. .................. 438/613; 438/652; 438/687
(58) Field of Classification Search ........ 438/612, 438/613, 652, 654, 687; 257/737, 738, 750, 257/762
See application file for complete search history.

(56) References Cited

U.S. PATENT DOCUMENTS

| 7,122,403 | B2 | 10/2006 | Chandran et al. | |
|---|---|---|---|---|
| 7,183,648 | B2 | 2/2007 | Ramanathan et al. | |
| 7,208,834 | B2* | 4/2007 | Lee et al. | 257/737 |
| 7,476,564 | B2* | 1/2009 | Chen et al. | 438/107 |
| 2006/0094226 | A1 | 5/2006 | Huang et al. | |
| 2006/0276022 | A1* | 12/2006 | Li et al. | 438/612 |

FOREIGN PATENT DOCUMENTS

| JP | 56032748 A | * | 4/1981 |
|---|---|---|---|
| KR | 1020050050058722 | | 6/2005 |
| WO | WO 2005/057617 | | 6/2005 |

* cited by examiner

*Primary Examiner*—Kevin M Picardat
(74) *Attorney, Agent, or Firm*—IPLA P.A.; James E. Bame

(57) ABSTRACT

Copper pillar tin bump on semiconductor chip comprises a copper layer composed on chip and a tin layer entirely wrapping whole outer surface of said copper layer. A method for forming of the copper pillar tin bump on semiconductor chip comprises: composing the first copper layer on said chip; applying photoresist to said first copper layer, exposing and developing a part of said photoresist, composing the copper pillar layer at the developed part of photoresist, composing the upper tin layer, removing said photoresist, removing said the first copper layer except disposing place of copper pillar layer, composing side tin layer. The minute pattern makes it possible to form a high density packaging by reducing a pitch of copper pillar tin bump. Signal delay can be reduced by low electric resistance, and underfill can be easily soaked.

5 Claims, 6 Drawing Sheets

COPPER PILLAR TIN BUMP ON SEMICONDUCTOR CHIP AND METHOD OF FORMING THE SAME

CROSS REFERENCE

This application claims foreign priority under Paris Convention and 35 U.S.C. §119 to Korean Patent Application No. 10-2007-0117201, filed Nov. 16, 2007 with the Korean Intellectual Property Office.

BACKGROUND OF THE INVENTION

The present invention relates to copper pillar tin bump on semiconductor chip and method of forming of the same, and more particularly, through the simple progress of single photoresist patterning to compose the copper pillar tin bump, it's possible to simplify the progress and reduce the production costs.

Related prior patents are U.S. Pat. No. 7,183,648, USPub. 2006/0094226, U.S. Pat. No. 7,122,403, International Application No. PCT/US2004/040197.

These days, electronic products has been rapidly developed and it was caused by four factors, techniques of semiconductor designing, semiconductor packaging, semiconductor manufacturing, software programming.

A techniques of semiconductor designing includes composing over millions of cells, high speed data processing, heat radiation, composing line width under micron skills, but techniques of semiconductor packaging was relatively fall behind, so electric performance of semiconductor was determined by packaging and electric connectivity rather than it's performance.

Actually, over 50% of total electric signal delay of high speed electronic products occurs by packaging delay which is generated between chips, and expectedly, it's portion grows bigger to over 80% when systems get larger, so importance of packaging techniques becomes higher.

Recently, due to enhanced packaging performance, market demands on small size package, new substrate techniques and assembling progresses, semiconductor chip packaging market has been grown faster.

Such packaging techniques was solder paste screen painting by using screen printer, but it has limitation of minimum pattern size, restriction of minimum pitch of metal mask and solder paste printing resolution to make high density semiconductor chip packaging.

On the other hand, high density chip packaging techniques has been developed by using tin electroplating recently, but in this way, parasite resistance can be occurred by small packaging thickness between chip and board and thin insulation layer among boards, and it can have problem with durability because it is not good enough to be a mechanical stress absorption layer.

SUMMARY OF THE INVENTION

The purpose of the present invention is to solve above-described problems, and is to provide copper pillar tin bump on semiconductor chip and method of forming of the same which has a minute pattern composed by exposure that makes it possible to form a high density packaging by reducing a pitch of copper pillar tin bump.

Another purpose of the present invention is to provide copper pillar tin bump on semiconductor chip and method of forming of the same which is possible to form the high density packaging by simple progress of single photoresist patterning progress.

Another purpose of the present invention is to provide copper pillar tin bump on semiconductor chip and method of forming of the same which signal delay can be reduced by reduced parasite resistance because of low electric resistance.

Another purpose of the present invention is to provide copper pillar tin bump on semiconductor chip and method of forming of the same which has enough height for easy soaking underfill which is to form the mechanical stress absorption layer.

To achieve said object, copper pillar tin bump on semiconductor chip according to present invention comprising a copper layer composed on chip and a tin layer entirely wrapping upper part and side part of said copper layer.

Here, said copper layer is formed by a first copper layer which is composed on said chip, and a copper pillar layer which is composed at upper side of the first copper layer.

Preferably, said first copper layer is formed by evaporation process, and said copper pillar layer is formed by plating process.

And, said tin layer is formed by an upper tin layer which covers upper part of copper pillar layer, and a side tin layer which covers side part of copper pillar layer, meanwhile, thickness of said upper tin layer and said side tin layer are different from each other.

Preferably, said upper tin layer and said side tin layer are made of pure tin.

Meanwhile, a method for forming of the copper pillar tin bump on semiconductor chip according to present invention comprising; forming the first copper layer on said chip, applying photoresist to said first copper layer, exposing and developing a part of said photoresist where copper pillar layer should be formed, forming the copper pillar layer at the developed part of photoresist, composing the upper tin layer on said upper part of copper pillar, removing copper layer from side part of said copper pillar and from said first copper layer in the part except disposed area of said copper pillar layer, forming side tin layer at side part of copper pillar layer.

Preferably, said first copper layer is composed by evaporation process, and said copper pillar is composed by plating process.

Preferably, said upper tin layer and said side tin layer are made of pure tin.

And, thickness of said upper tin layer and said side tin layer are different from each other.

Here, at least one of said upper tin layer and said side tin layer is composed by electroless plating.

By the present invention, the minute pattern which is composed by exposure makes it possible to form a high density packaging by reducing a pitch of copper pillar tin bump.

And, it's possible to form the high density packaging by simple progress of single photoresist patterning progress.

And, signal delay can be reduced by reduced parasite resistance because of low electric resistance, and underfill to form mechanical stress absorption layer can be easily soaked.

And, after chip packaged on substrate, it's possible to prevent spreading of copper component which is heated by conducted heat and oxidation of copper components.

BRIEF DESCRIPTION OF THE DRAWING

The drawings attached illustrate the preferable embodiment of the present invention, only helps further understanding of the idea of the present invention along with the detailed description of the present invention described in the below, and thus the present invention is not limitedly interpreted to the matters shown in the drawings.

| * Explanation of indicating marks of figure | |
|---|---|
| 10: substrate | 20: first copper layer |
| 30: copper pillar layer | 50: upper tin layer |
| 52: side tin layer | |

DETAILED DESCRIPTION OF THE INVENTION

Hereinafter, the present utility is described in detail with reference to the attached drawings.

Before the detailed description, it should be noted that the terms used in the present specification and the claims are not to be limited to their lexical meanings, but are to be interpreted to conform with the technical idea of the present invention under the principle that the inventor can properly define the terms for the best description of the invention made by the inventor.

Therefore, the embodiments and the constitution illustrated in the attached drawings are merely preferable embodiments according to the present invention, and thus they do not express all of the technical idea of the present invention, so that it should be understood that various equivalents and modifications can exist which can replace the embodiments described in the time of the application.

Figure 1:
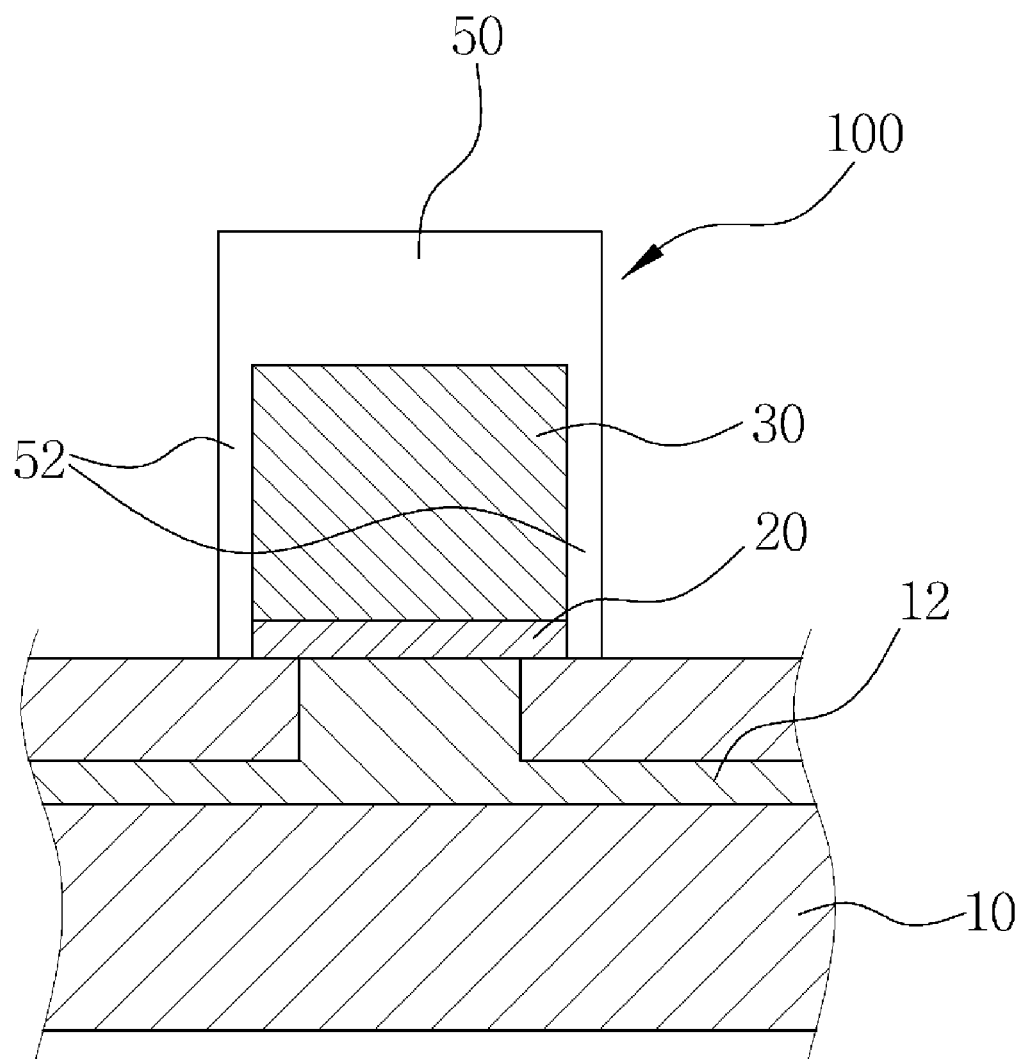
FIG. 1 is cross sectional view of copper pillar tin bump according to present invention.

FIG. 1 is cross sectional view of copper pillar tin bump according to present invention.

Referring to FIG. 1, copper pillar tin bump (100) according to present invention is composed on semiconductor chip (10), and said copper pillar tin bump (100) comprising a copper layer (20, 30) formed on chip (10) and a tin layer (50) entirely wrapping upper part and side part of said copper layer.

Here, said copper layer (20, 30) is formed by a first copper layer (20) which is composed on said chip (10), and a copper pillar layer (30) which is composed at upper side of the first copper layer (20).

Generally, a bump is conductive projection to directly connect semiconductor chip with substrate.

This bump has two roles, the first, increase height of electrode for easy packaging, and the second, exchange a material of electrode with material which can easily connect to outer electrode.

Meanwhile, in case of standard solder bump, a shape of said bump is formed as ball by surface tension effect, but when bump is composed with plating by specific metals like gold, it's shape can be a square pillar.

A general material for said bump is made of metals like gold, solder, tin, and conductive resin which is mixture of resin and metals, and resin-metal-complex material which resin coated by metals.

Copper pillar tin bump according to present invention comprising the first copper layer (20) which is composed on connection pad (12) region for electric contact of semiconductor chip (100), and the copper pillar layer (30) which is composed at upper side of the first copper layer (20).

Said the first copper layer (20) is composed by evaporation progress on side of said chip (100) where said connection pad (12) is exposed to outside for plating composing of said copper pillar layer (30), and after that, said copper pillar layer (30) is composed by plating progress on said the first copper layer (20).

Due to copper layer (20, 30) comprising said the first copper layer (20) and copper pillar layer (30), by ensuring high electric conductivity and high heat conductivity, reducing parasite resistance is possible, and because of reduced parasite resistance, signal delay can be prevented.

Moreover, mechanical reliability can be improved by strength of copper layer (20, 30), and space to filling progress of underfill's easy soaking can be secured.

It is advisable for cross sectional view of said copper pillar layer (30) to be a circle, but it's not limited to that, and it can be a rectangle shape.

Meanwhile, after chip (100) packaged on substrate, to prevent minute spreading of copper component due to conducted heat on said copper layer (20, 30) and oxidation of said copper layer (20, 30), tin layer (50, 52) of copper pillar tin bump (100) according to present invention covers not only upper part (50) of said copper layer (20, 30) but also whole outer surface of said copper layer (20, 30).

Here, said tin layer (50, 52) is formed with an upper tin layer (50) which is covering upper part of said copper pillar layer (30), and a side tin layer (52) which is covering side part of said copper pillar layer (30), and thickness of said upper tin layer (50) and said side tin layer (52) are different from each other.

Copper pillar tin bump (100) according to present invention, said upper tin layer (50) and said side tin layer (52) are made of pure tin.

Heretofore, by means of soldering for electric contact, mixture of tin and lead has been used to make an alloy of low melting point.

But, the fact of said lead component can damages people's kidney, liver, blood and central nervous system has been proven by medical researches.

Recently, many international law of prohibit from using lead on products has been suggested, and most aggressive and well known effort is "Waste Directive in Electrical and Electronic Equipment" of the European Union which is prohibits from using lead on electronic products by 2008.

As said before, by composing said tin layer (50, 52) with leadless pure tin, it's possible to form environment friendly packaging and it satisfies various kinds of international environmental laws.

Figure 2A:
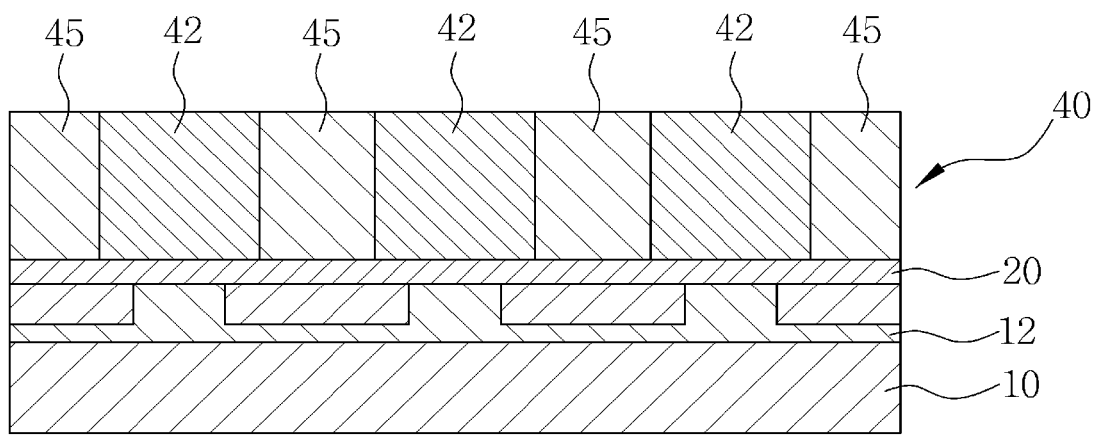
FIGS. 2a-2d and FIGS. 3a-3c each show method for forming copper pillar tin bump according to present invention.
Figure 2B:
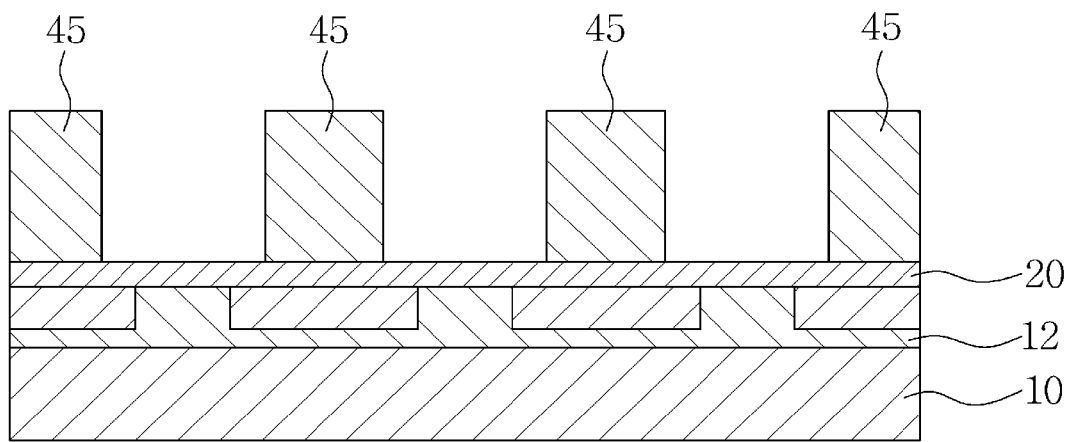
Figure 2C:
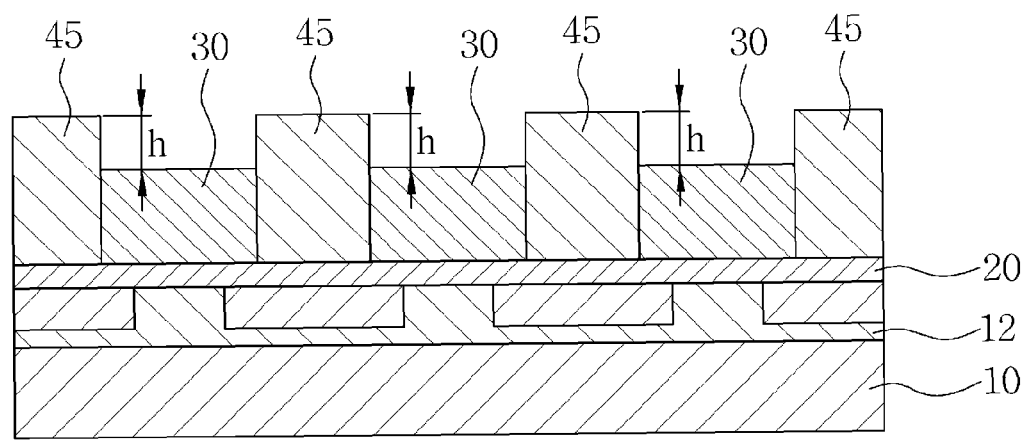
Figure 2D:
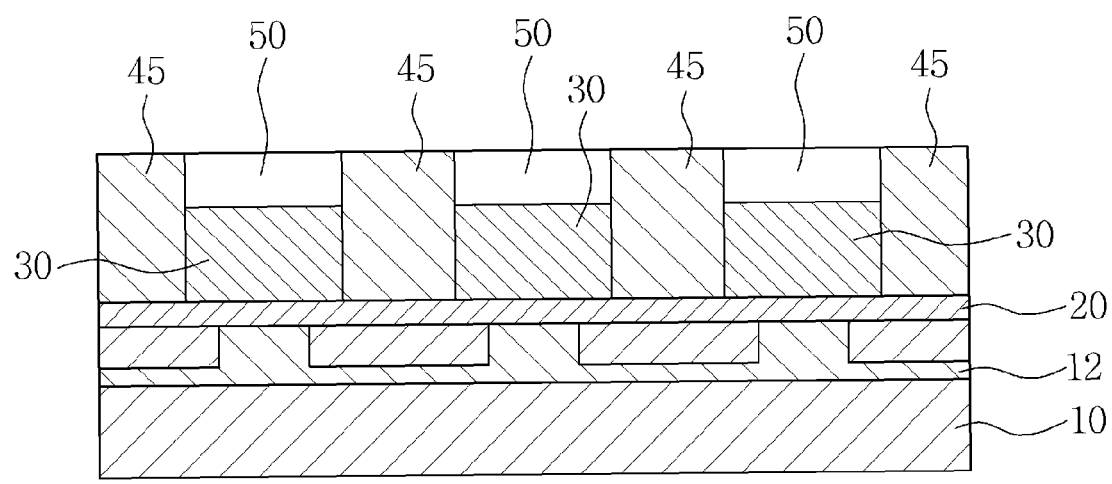
Figure 3A:
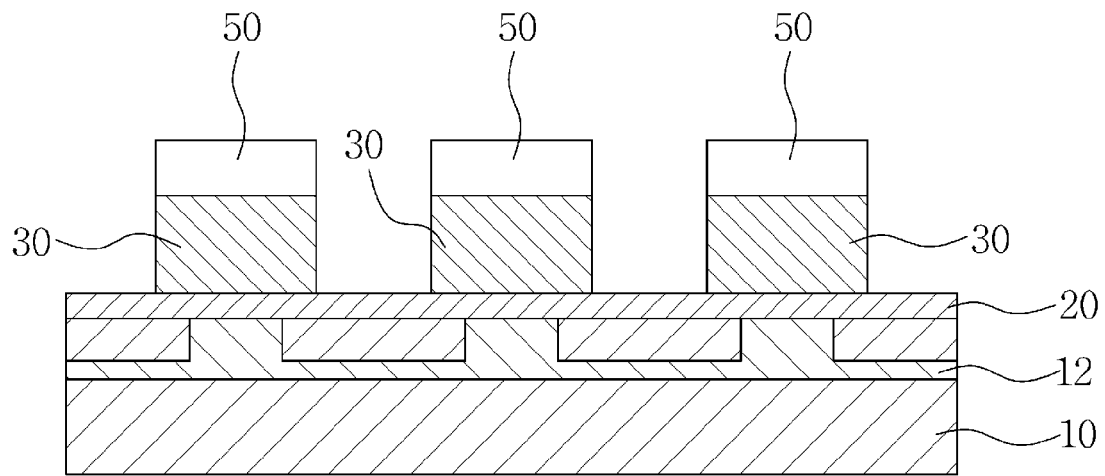
Figure 3B:
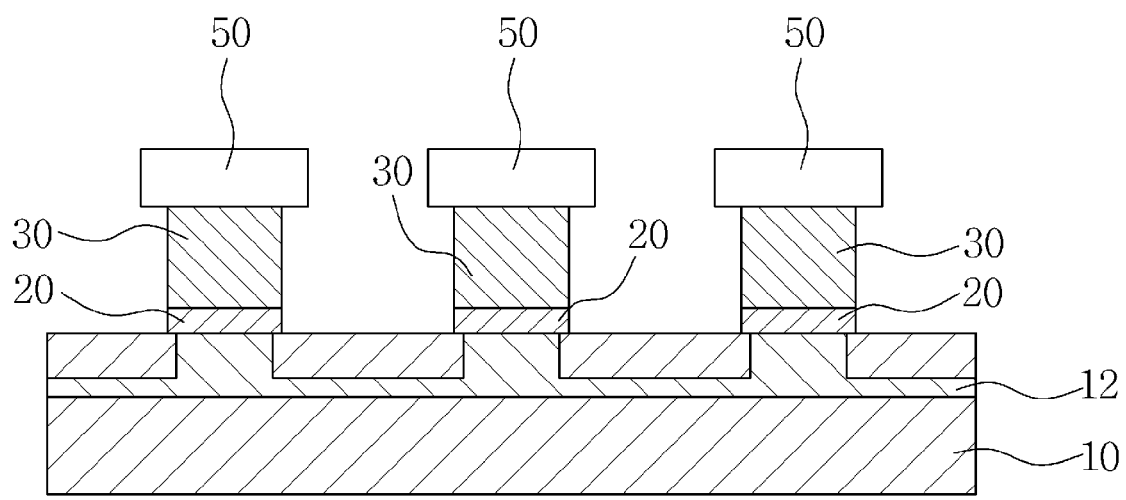
Figure 3C:
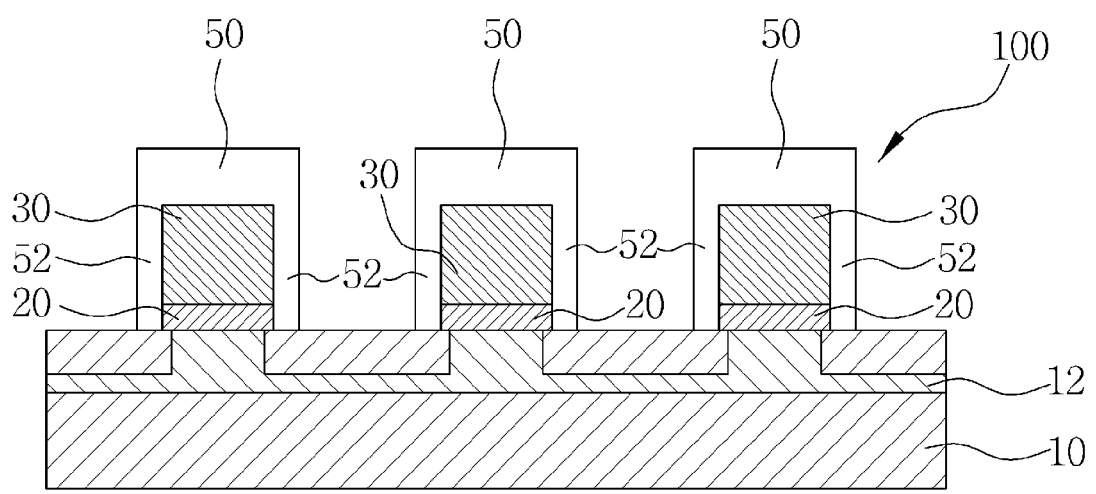
Figure 4:
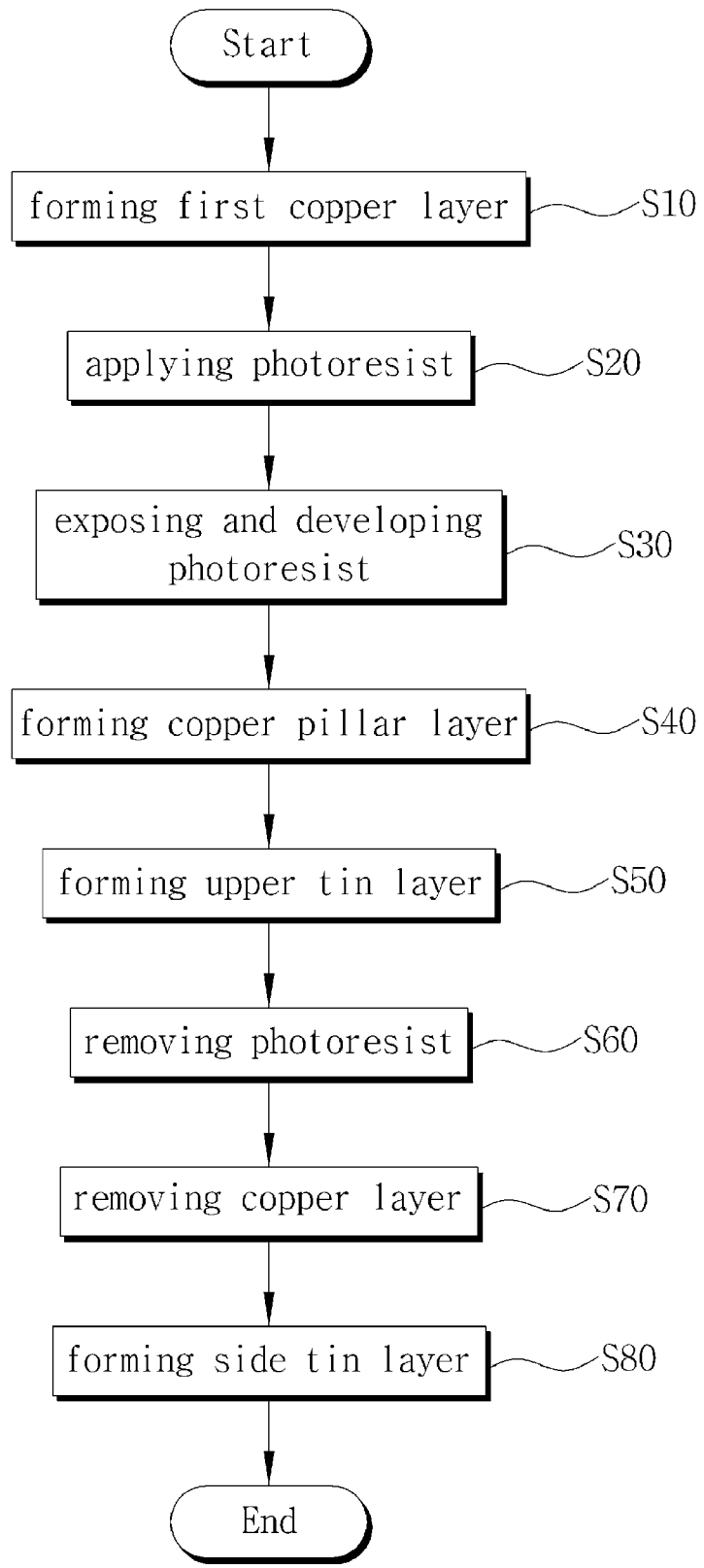
FIG. 4 is flow cart of forming copper pillar tin bump according to present invention.

FIGS. 2a-2d and FIGS. 3a-3c each show method for forming copper pillar tin bump according to present invention, and FIG. 4 is flow cart of forming copper pillar tin bump according to present invention.

Referring from FIGS. 2a-2d to FIG. 4, a method for forming of the copper pillar tin bump (100) on semiconductor chip comprising; forming the first copper layer (20) on said chip (10) (step 10), applying photoresist (40) to said first copper layer (20) (step 20), exposing and developing a part (42) of said photoresist (40) where copper pillar layer should be formed (step 30), forming the copper pillar layer (30) at the developed part (42) of photoresist (step 40), forming the upper tin layer (50) on said upper part of copper pillar (30) (step 50), removing said photoresist (45) (step 60), removing copper layer from side part of said copper pillar (30) and from said first copper layer (20) in the part except disposed area of said copper pillar layer (30)(step 80), composing tin layer at out side part of copper pillar layer (30) (step 80).

Here, said first copper layer (20) is composed by evaporation on semiconductor chip (10) for plating composing of said copper pillar layer (30) (step 10).

After this, photoresist (40) which for composing copper pillar (30) and tin bump (50) applies at upper side of said the first copper layer (20) (step 20). (FIG. 2a)

After this, a part of said photoresist (40) where said copper pillar layer (30) and tin bump (50) will be composed removed by exposure and development through progress of photolithograph patterning which is using mask (step 30). (FIG. 2b)

After this, said copper pillar layer (30) composes on the part where said photoresist (40) was located, by method of plating (step 40). (FIG. 2c)

A height of said copper pillar layer (30) can be adjust by thickness of said photoresist (40), and generally the height of said photoresist can be set to about 50 μm, but it's not limited by this.

At this time, said copper pillar layer (30) is composed by plating and it's height is lower than thickness of said photoresist (40) by regular height (h), and said regular height (h) can be set to about 5 μm, but it's not limited by this.

After this, upper tin layer (50) is composed on upper part of said copper pillar layer (30) by plating and it fills said height (h) (step 50). (FIG. 2d)

After this, said photoresist (45) is removed by solvent (step 60), at this time, atmospheric pressive plasma can be used to remove rest of photoresist safely which is located at out side of said copper pillar layer (30) and upper tin layer (50). (FIG. 3a)

After this, said the first copper layer (20) is removed by etching progress except disposed area of copper pillar layer (30) (step 70), in this way, every copper pillar layer (30) is electrically separated from one another. (FIG. 3.b)

At this time, not only said first copper layer (20) but also a portion (about same thickness with first copper layer) of outside of said copper pillar layer is removed by said etching progress.

After this, tin layer is composed by plating in regular height as thickness of removed said copper pillar layer (30) (step 80), and composing side tin layer (52) to wrap whole outer surface of said copper pillar layer (30).

Here, one of method of electroplating and electroless plating can be used to compose said upper tin layer and side tin layer (50, 52), but for composing side tin layer (52), electroless plating is more facile.

Seeing that, the embodiments and the constitution illustrated in the attached drawings are merely preferable embodiments according to the present invention, and thus they do not express all of the technical idea of the present invention, so that it should be understood that various equivalents and modifications can exist which can replace the embodiments described in the time of the application.

What is claimed is:

1. A Method for forming of the copper pillar tin bump on semiconductor chip comprising;
    forming the first copper layer on said chip;
    applying photoresist to said first copper layer;
    exposing and developing a part of said photoresist where copper pillar layer should be formed;
    forming the copper pillar layer at the developed part of photoresist;
    forming the upper tin layer on said upper part of copper pillar;
    removing said photoresist;
    removing copper layer from side part of said copper pillar and from said first copper layer in the part except disposed area of said copper pillar layer;
    forming side tin layer at side part of copper pillar layer.

2. The Method for forming of the copper pillar tin bump on semiconductor chip according to claim 1, wherein, said first copper layer is composed by evaporation process, and said copper pillar is composed by platingprocess.

3. The Method for forming of the copper pillar tin bump on semiconductor chip according to claim 2, wherein, said upper tin layer and said side tin layer are made of pure tin.

4. The Method for forming of the copper pillar tin bump on semiconductor chip according to claim 3, wherein, thickness of said upper tin layer and said side tin layer are different from each other.

5. The Method for forming of the copper pillar tin bump on semiconductor chip according to claim 2, wherein, at least one of said upper tin layer and said side tin layer is composed by electroless plating.

* * * * *